United States Patent [19]
Myers et al.

[11] Patent Number: 5,281,772
[45] Date of Patent: Jan. 25, 1994

[54] ELECTRICAL CONNECTOR HAVING ENERGY-FORMED SOLDER STOPS AND METHODS OF MAKING AND USING THE SAME

[75] Inventors: Bruce A. Myers, Kokomo; John K. Isenberg, Rossville; Christine R. Coapman; James A. Blanton, both of Kokomo, all of Ind.

[73] Assignee: Delco Electronics Corporation, Kokomo, Ind.

[21] Appl. No.: 783,468

[22] Filed: Oct. 28, 1991

[51] Int. Cl.⁵ .............................................. H05K 1/00
[52] U.S. Cl. ..................................... 174/267; 174/259; 174/260; 361/807; 29/827; 29/830
[58] Field of Search ............... 174/259, 260, 267, 255; 29/827, 830; 361/404, 406, 417; 357/68, 69, 70

[56] References Cited

U.S. PATENT DOCUMENTS

| | | | |
|---|---|---|---|
| 3,405,224 | 10/1967 | Yawata et al. | 357/68 X |
| 4,554,732 | 11/1985 | Sadlo et al. | 29/620 |
| 4,766,268 | 8/1988 | Uggowitzer | 174/68.5 |
| 4,779,339 | 10/1988 | Ohtani et al. | 29/846 |
| 4,847,003 | 7/1989 | Palanisamy | 252/514 |
| 4,859,808 | 8/1989 | Jeter et al. | 174/68.5 |
| 4,931,323 | 6/1990 | Manitt et al. | 427/53.1 |
| 4,959,751 | 9/1990 | Hearn et al. | 361/406 |
| 5,004,640 | 4/1991 | Nakatani et al. | 174/255 |
| 5,041,901 | 8/1991 | Kitano et al. | 357/70 |
| 5,113,239 | 5/1992 | Cini et al. | 357/68 |

OTHER PUBLICATIONS

Myers et al, "Method of Fabricating Thick Film Solder Attach Pads for Fine Pitch Flip Chips", No. 316121 Research Disclosure Aug. 1990.
Keeler, "Lasers for High-Reliability Soldering", Electronic Packaging & Production, Soldering Technology, Oct. 1987, pp. 29-31.
Patent Abstracts of Japan vol. 8, No. 226 (E-272) Oct. 17, 1984 & JP-A-59 106 140 (Matsushita Denshi Kogyo) Jun. 19, 1984 *abstract*.
Patent Abstracts of Japan vol. 14, No. 537 (E-1006) Nov. 27, 1990 & JP-A-22 28 050 (Hitachi Ltd) Sep. 11, 1990 *abstract*.
Patent Abstracts of Japan vol. 14, No. 463 (E-988) Oct. 8, 1990 & JP-A-21 87 045 (Sharp Corp) Jul. 23, 1990 *abstract*.
European Search Report No. EP 92 20 2815 dated Jan. 13, 1993 corres. to U.S. Ser. No. 07/783,468.
Annex to European Search Report No. EP 92 20 2815 dated Jan. 13, 1993.

*Primary Examiner*—Leo P. Picard
*Assistant Examiner*—Cheryl R. Figlin
*Attorney, Agent, or Firm*—Cary W. Brooks

[57] ABSTRACT

A method of forming solder stops on a thick film, comprising a conductive metal and an inorganic oxide, including the step of directing a laser beam onto the film to form a surface consisting essentially of fused inorganic oxides which acts as a solder stop.

15 Claims, 6 Drawing Sheets

ELECTRICAL CONNECTOR HAVING ENERGY-FORMED SOLDER STOPS AND METHODS OF MAKING AND USING THE SAME

FIELD OF THE INVENTION

This invention relates to electrical connectors having energy-formed solder stops and methods of making and using the same. More particularly, this invention relates to electrical connectors having an energy formed stop prepared from a single conductor print pattern.

BACKGROUND OF THE INVENTION

Electrical interconnections are required for electrically connecting an integrated circuit chip to an electrical circuit and a supporting substrate. Typically, the integrated circuit has small solder balls or "bumps" attached to those regions where electrical contact will be made. The integrated circuit is in position such that the bumps contact the electrical circuit on a supporting substrate in the appropriate regions.

In addition to the conventional thick and thin film technologies wherein an electrical circuit is printed or deposited on the surface of a substrate so as to form a patterned circuitry, many methods are known for forming the electrical interconnections between an integrated circuit and the electrical circuit on a supporting substrate. Regardless of the particular soldering method used for attaching the chip to a supporting substrate, for enhanced reliability it is desirable to control the amount of solderable surface area on each of the integrated circuit contacts on the substrate. If the solderable surface area of the contact, as defined by the conductor area enclosed by a surrounding dielectric, is too large, the mass of solder which forms the bump has a propensity to shear off during exposure to the widely varying temperature ranges of operation. Therefore, the actual contact area between the individual solder bump on the integrated circuit and the contact region of the conductor must be optimally minimized.

Generally, the amount of contact area should be controlled and minimized by providing a conductor having a predetermined, optimal width in the contact region. Further, a dielectric region should be provided, referred to as a solder dam or solder stop, on the conductor in the contact area to prevent the solder from wicking or flowing down the conductor.

Flexible solder bumps serve a variety of functions. Generally, flexible solder bumps serve: as an electric connection between the integrated circuit chip and the conductors on the circuit board; to keep the integrated circuit chip elevated above the board so that the solder flux residue may be washed off of the circuit board and away from the integrated circuit chip where the flux can cause damage; to dissipate heat away from the integrated circuit chip; and to accommodate differences in thermal expansion between the integrated circuit chip and the circuit board during operation of the device. Solder bumps when uniform in dimension allow for an overall higher current density through the device. The flexible solder bumps may be attached to the chip by a variety of methods including plating or by using solder balls.

Prior to the present invention, solder dams or solder stops consisted of thick film of dielectric films deposited over the conductor layer, wherein a trough is patterned within the dielectric layers. Within the trough there is no dielectric material present. The solder is retained in the trough and between the stops to connect the integrated circuit and the conductors.

Numerous disadvantages exist with respect to prior art solder dam or stop designs. The alignment between the conductor layer and the solder dam layer must be maintained quite strictly or substantial misalignment results between the two layers. When there is even slight misalignment between layers, the conductors do not align with the solder dam or conductive bumps on the integrated circuit. Therefore, there may be electrical connection which are formed only partially or not at all, resulting in diminished integrity of the electrical connections and the electrical circuit as a whole. Further, such designs require multiple printing and firing steps. First, the conductive lead must be printed and then fired. Second, the solder dam must be printed over the fired conductive lead and the device fired again. Still further, the use of a second printed layer to provide a solder dam or stop cannot be printed with great accuracy and often have widths arranging from 0.010" to about 0.020".

It would therefore be desirable to provide an electrical interconnection lead prepared from a single printing and firing, and which provided a solder stop with great precision and minimal width.

SUMMARY OF THE INVENTION

In a broad sense, the invention includes an electrically conductive lead, adhered to a substrate, and having a top surface portion consisting essentially of fused inorganic oxide. The fused inorganic oxide serves as a solder stop. The conductive lead is formed from a single printing of a composition containing a conductive material and an inorganic oxide. The fused inorganic oxide on the top surface of the conductive lead is formed by energizing a selective portion of the printed composition so that essentially only the fused inorganic oxide is formed at the top surface of the conductive lead in the area where the energy is imparted.

In a broad sense, the invention also includes a method of forming an electrically conductive lead having a solder stop. A composition including a conductive material and an inorganic oxide is printed on a substrate to form a printed pattern. A portion of the printed pattern is selectively energized so that the top surface of the portion of the printed pattern forms essentially fused inorganic oxide which acts as a solder stop. The printed pattern so energized is then sintered to form an electrically conductive lead firmly adhered to the substrate. The printed pattern may be energized by directing a laser beam thereon or by other means suitable for forming fused inorganic oxide at the surface of a selected portion of the printed pattern.

In a broad sense, the invention also includes an electrical interconnection lead pattern/integrated circuit chip combination. A plurality of electrical conductors, each having a contact region wherein the conductor is electrically connected by a flexible solder bump to a predetermined region on a substantially rectangular shaped integrated circuit chip. Each contact region is substantially straight and substantially perpendicular to an associated side of the rectangular shaped integrated circuit chip. The flexible solder bump is isolated from the remainder of the conductor by a region on the top surface of the conductor consisting essentially of fused inorganic oxide.

The present invention provides many advantages over the prior art. A conductive lead having a solder stop thereon can be formed from a single printing and firing of an electrical lead pattern. The solder stop formed by energizing a printed pattern of a composition including a conductive material and inorganic oxides results in a conductive lead wherein the top surface of the solder stop is substantially the same distance from the substrate as is the rest of the conductive lead. When the solder stop is formed by directing a laser beam to a selective portion of the printed pattern, the solder stop can be formed with great accuracy and with minimal width. Further, forming a solder stop with a laser beam increases the ability to accurately control and limit the flow of solder from the solder bump. The present invention allows the lead density to be increased because the use of laser formed solder stops allows the use of substantially straight and perpendicular lead patterns to the integrated circuit chip. The present invention eliminates the need for "L-shaped" lead patterns of the prior art. Further, the use of laser formed solder stops may be performed within less than plus or minus 0.001" of the proper location relative to the chip bump pattern.

BRIEF DESCRIPTION OF THE DRAWINGS

FIG. 6 is a photomicrograph of the conductor having a solder stop illustrated in FIG. 5 and magnified 620 times.

FIG. 7 is a photomicrograph of the conductor of FIG. 8 magnified 1200 times.

FIG. 9 is a photomicrograph of the conductor having a solder stop illustrated in FIG. 8 and magnified 620 times.

FIG. 10 is a photomicrograph of the conductor of FIG. 9 magnified 1200 times.

FIG. 11 is a cross-sectional view of a conductor having a solder stop of the present invention.

FIG. 12 is a cross-sectional view of a conductor having a solder stop of the present invention taken along the longitudinal axis of the conductor.

DETAILED DESCRIPTION

Figure 1:
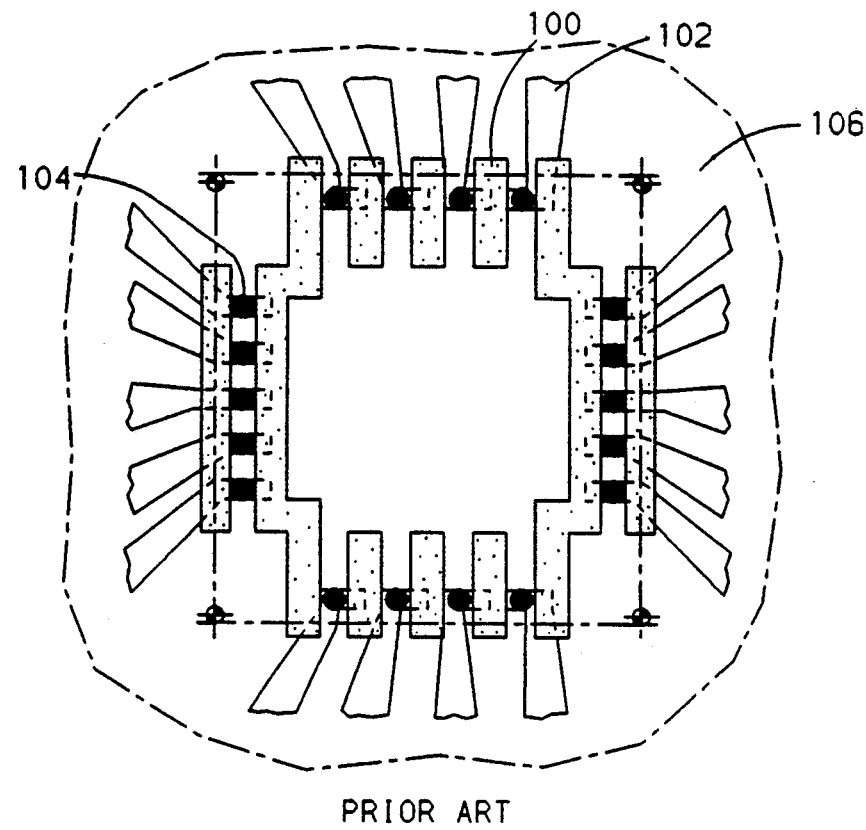
FIG. 1 shows conductive lead patterns of the prior art.

As used herein, the term "printed circuit board" is intended to encompass a support member that may be rigid or flexible, laminated or not, of any suitable composition on which a printed pattern of electrical conductors is provided. The term "printed pattern" is intended to encompass the pattern on a substrate formed by any suitable process, including, but not limited to, silk screen printing, photolithography, evaporation, plating, stenciling, ink wiring, plasma deposition, sputtering, adhesives, or thin film or thick film techniques.

A printed circuit board having a semi-conductor chip or other electrical module attached thereto shall be denoted as a printed circuit board assembly. It will be convenient generally to discuss the invention with particular reference to a printed circuit board assembly including a semi-conductor chip on the surface mounted or a flip chip type.

Such a chip typically has formed thereon an integrated circuit containing a number of electrical contacts (terminals) on one surface. The contacts are typically soldered or otherwise electrically connected to the conductors of the printed circuit board.

A printed pattern of a conductive material may be formed on a substrate by any one of the above suitable processes. Generally when the process is a silk screen printing process, the wet pattern has a thickness ranging from about 0.0008" to about 0.0015". When the printed pattern is allowed to dry, the pattern has a thickness of ranging from about 0.0004" to about 0.0012". When the printed pattern is fired, the pattern has a thickness ranging from about 0.0002" to about 0.0008".

The pattern may be formed by a variety of suitable compositions which in general comprise a conductive material and an inorganic oxide. Suitable conductive materials include at least one selected from the group consisting of Ag, Pd, Pt, and Cu. Suitable inorganic oxides include at least one selected from the group consisting of lead, ruthenium, cobalt, bismuth, copper and zinc and glass frit containing oxides of silica, aluminum, boron and calcium. Preferably, the composition also includes a solvent, such as terpineol. The composition may also include an organic binder such as ethyl cellulose. The conductive material may comprise from about 10% to about 90%, preferably about 30% to about 90% and most preferably about 75% by weight of the composition. The conductive material is preferably in a powder form. The inorganic oxide may comprise about 3% to about 40%, preferably about 5% to about 20%, and most preferably about 10% by weight of the composition. The solvent may comprise about 1% to about 25% by weight of the composition. The inorganic binder may be about 5% to about 15% by weight of the composition. The solder material may include lead and indium (tin, Ag). A suitable solder material is manufactured by Delco.

The present invention including a method of making a solder stop on a conductive lead is useful in any situation where a component, device or element is to be attached to the conductive lead by means of solder. The method is particularly useful in the assembly of "flip-chip" devices using a "flexible solder bump". Flip-chip mounting is a method developed for attaching active elements to film circuits eliminating the need for separate wire bonding. For example, a semi-conductor device, such as a transistor, diode or integrated circuit, may be first covered with a glass layer, which provides mechanical or environmental protection. Holes may be formed into the glass layer directly over the metallic contact pads of the semi-conductor device. Then a metallic film may be selectively evaporated over the glass surface to penetrate to the holes and contact the semi-conductor contact pads. The holes may be then filled with ball-shaped solder. The solder balls may be attached to the chip by heating the wafer and causing the solder in the hole to reflow and to make a good electrical mechanical connection. The solder balls would then extend above the glass surface coating the semi-conductor device. The chip may be then turned upside down, and the protruding portion of the solder balls can be utilized to contact conductive layers of a thin film structure.

A means for reflowing the solder balls may be similar to that used to attach the balls to the semi-conductor is used to make the final connection. However, if the solderable surface, is too large, the mass of solder which forms the bump becomes too thin due to the flow of solder and has a propensity to shear off during exposure to a wide variety of operating temperatures. Therefore, the flow of solder must be restricted by a solder stop or solder dam.

According to the present invention, after a wet printed pattern has been applied to a substrate, the dried and fired portion of the fired pattern is selectively energized. One preferred method of energizing this portion is by directing a laser beam onto the portion of the conductive pattern. It is believed that the energizing source such as laser beam causes the inorganic oxides in the fired pattern to rise to the surface and fuse together. Alternative, the energization of the surface may cause the conductive particles to be vaporized leaving only inorganic oxides at the surface. Whatever the mechanism, the laser beam or energy source is directed onto the fired pattern for a period of time less than that required to cut the pattern through its thickness. The step of energizing a selective portion of the fired pattern, sufficient to form a solder stop after completion of all the process steps, is performed until there is a noticeable color change in the fired pattern without erosion of the printed pattern or a decrease in the height or thickness of the printed pattern. The term "without erosion of the printed pattern" means the thickness and electrical conductivity (i.e., not significantly increase resistance) of the runner has not been significantly changed by the exposure to the energy source. This energizing step or fused layer of inorganic oxide on the top surface of the printed pattern forms a solder stop.

A suitable laser for selectively energizing a portion of the printed pattern is available from Lee Laser under the trade name 708T. Such a laser may operate with the following range of equipment settings: Power—0.5 watt to 3 watt, Q Rate—10 kHz to 25 kHz, Bite Size—0.00005" to 0.0002", Mode—TMOO. The width of the solder stop formed by such a laser ranges from about 0.0005" to about 0.004". Preferably, the solder stop is formed perpendicularly to the longitudinal axis of the conductive lead. The laser may import an energy ranging from about 0.0005 joule to about 0.100 joule for a conductive lead having a width ranging from about 0.002 to about 0.25". Preferably, the laser beam is directed onto the printed pattern until there is a visual color change in the printed pattern but no erosion of the conductor or decrease in height of the pattern. After the solder stop has been formed, the height or distance from the substrate of the solder stop and the remainder of the pattern is substantially the same. Typically the solder stop may be made with a width ranging from about 0.0010" to about 0.0030". The use of a laser to form the solder stop is advantageous because it eliminates the need for a second printing of a dielectric material over the conductive lead as required by the prior art art method of making solder stops or solder dams. When a second printing is required for the dielectric material, the operator is not able to see the underlying conductive lead due to the silk screen mass. The use of a laser allows the operator to look directly onto the conductive lead and more specifically locate and accurately produce the solder stop. As shown in FIG. 1, the solder stop of the prior art is a dielectric material 100 printed over conductive leads 102 on a substrate 106, in a pattern to surround the area for the solder bump 104 on at least two sides.

Figure 2:
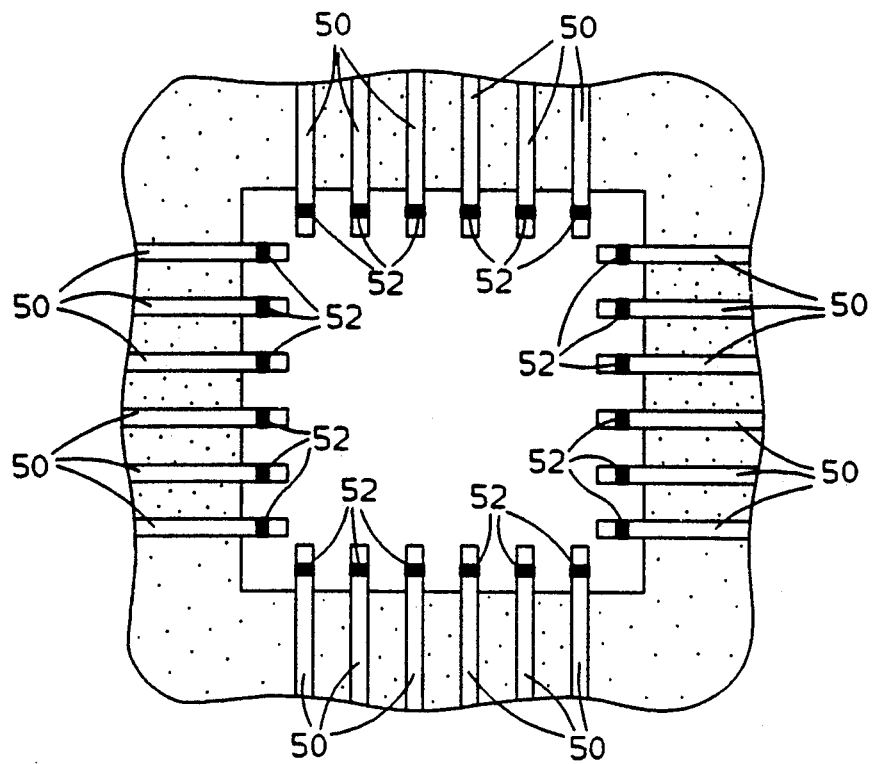
FIG. 2 is an illustration of a lead configuration of the present invention for a flip chip.

FIG. 2 illustrates a lead configuration of the present invention for a flip-chip. The leads 50 are arranged to accommodate a rectangularly shaped integrated circuit chip with a plurality of leads in spaced apart substantially parallel relationship to each other for an associated side of the chip. The use of laser formed solder stops 52 allows the stops to be positioned at substantially the same location on each lead of an associated side of the chip. This allows for the use of substantially straight leads having longitudinal axes which are substantially perpendicular to the edge of an associated side of the chip. Such an arrangement allows for increase density of leads along an associate side and the entire chip.

Figure 3:
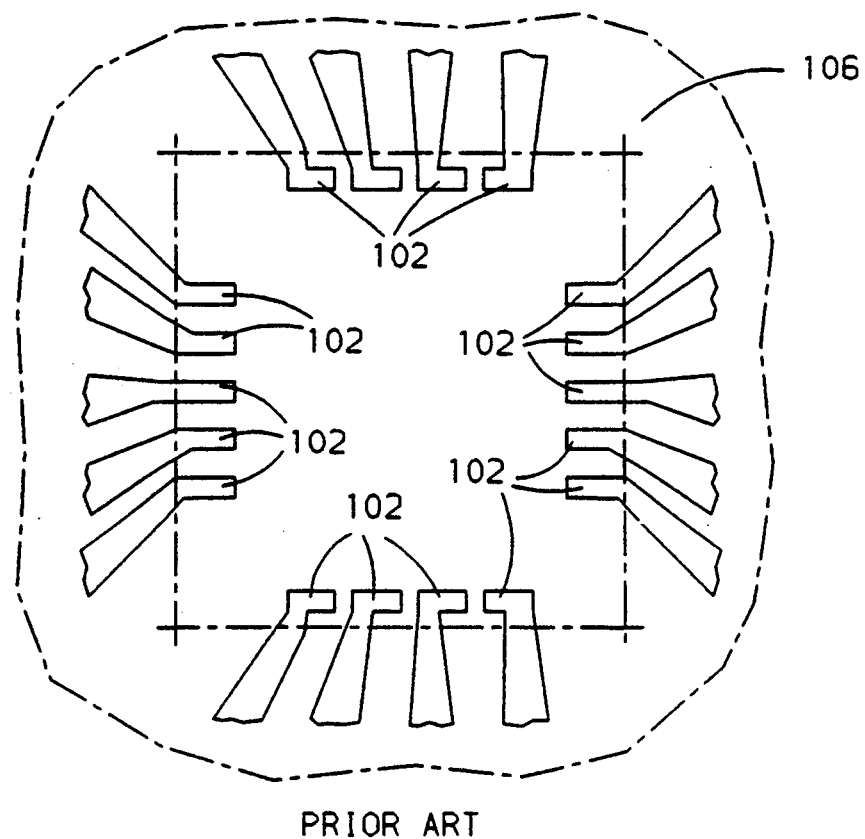
FIG. 3 shows an electrical lead pattern utilizing L-shaped connector portions of the prior art.

As shown in FIG. 3, prior art methods of forming solder stops or solder dams sometimes require the use of "L-shaped" conductive patterns 102. This is done to minimize print misalignment between the conductor and solder stop patterns due to print to print or mask registration tolerances. The use of a laser to form the solder stops eliminates the need for "L-shaped" conductive patterns because the laser can be controlled by optical pattern recognition of the conductor pattern. This allows precise placement of the solder stop area on the conductor pattern without the tolerances associated with screen printing, such as screen stretch and screen or mask alignment to the printed circuit board. Thus, the conductive leads can be positioned with respect to a rectangular shaped integrated circuit such that the contact region and the adjacent region of the conductive leads are substantially straight and a substantially perpendicular to an associated side of the integrated circuit. This allows for an increase density conductive leads along an associated side of a rectangular shaped integrated circuit.

Figure 4:
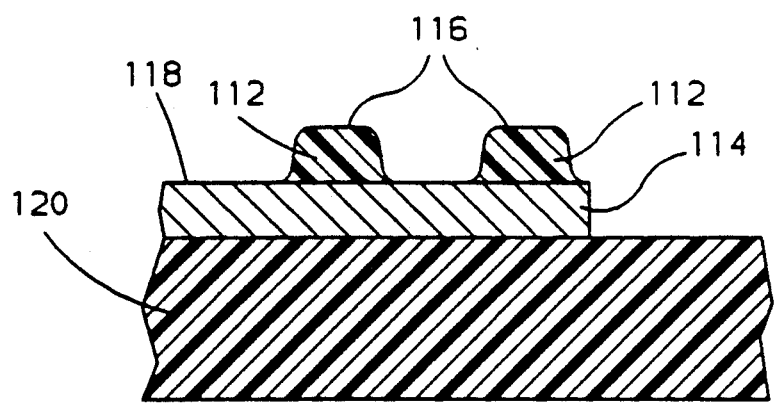
FIG. 4 is an illustration of a cross-sectional view of a conductive lead having a solder stop according to the prior art.

As shown in FIG. 4, the prior art method of printing a solder dam 112 over a conductive lead 114 results in the top surface 116 of the solder dam being substantially higher than the top surface 118 of the conductive lead. This is a disadvantage because it increases the difficulty of subsequent flux residue cleaning under the chip by restricting the flow of the cleaning agent. It also obscures the view of the solder bumps in any required visual inspection. In the present invention, as shown in FIG. 12, the top surface of the solder stop is at a height or distance from the substrate 22 which is substantially equal to the remainder of the conductive lead. This is advantageous because it enhances the ability to clean flux residue from under the chip, to visually inspect the solder bumps and to flow potting or conformal coating material under the chip in subsequent operations.

The following example is illustrative of the present invention.

A composition for printing a conductive lead is available from DuPont under the trade names 7484, 7474 and QS 170. These compositions may contain about 10% to about 90% by weight conductive material comprising at least one selected from the group consisting of Ag, Pd, Pt and Cu, about 3% to 40% by weight inorganic oxide comprising at least one selected from the group consisting of lead, ruthenium, cobalt, bismuth, copper and zinc oxides, about 1% to 25% by weight solvent such as terpineol and about 5% to 15% by weight of an organic binder such as ethyl cellulose. This composition is silk screened onto a substrate in a manner known in the art to produce a wet printed pattern. The substrate and printed pattern is fired at about 840° C. to about 860° C. to form a solid conductive lead adhered to the substrate.

A laser may be set at the setting described above. The laser emitter is placed a distance of approximately 6" away from the fired pattern and a beam is directed onto the fired pattern a distance of 0.004" to 0.010" from the end of the fired pattern. The beam is directed onto the fired pattern for approximately 0.003 seconds or until there is a noticeable color or surface structural change in the fired printed pattern without erosion of the pattern or a decrease in the height of the fired pattern. The solder stop formed by the laser beam has a width of approximately 0.003".

A semi-conductor device having solder balls secured to conductive pads in a manner described above may be aligned with the solid conductive lead on the substrate so that the solder balls contact the contact region of the conductive lead. The solder balls may be caused to reflow by heating the substrate, conductive lead and semi-conductor device in an IR furnace at a temperature of approximately 240° C. for approximately 25 seconds. The solder may be ramp cooled in the furnace to form electrical interconnection lead pattern and integrated circuit chip combination.

Figure 5:
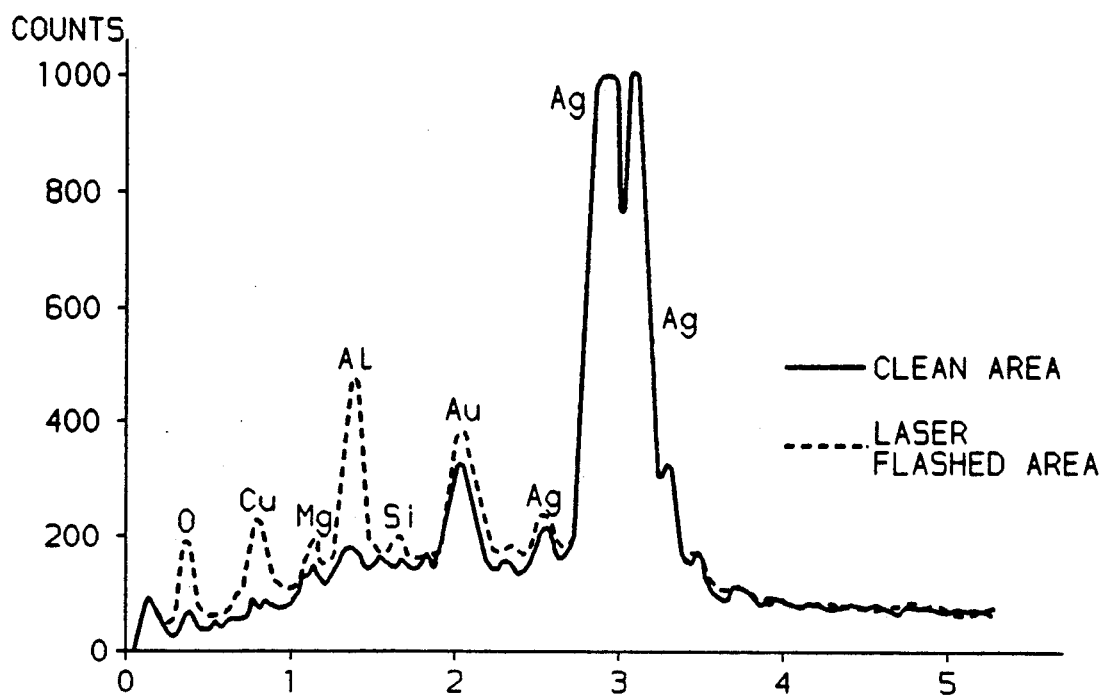
FIG. 5 is a graphical representation of the amount of conductive material on the surface of a conductor before and after making a solder stop according to the present invention.

FIG. 5 is a graphical representation of the relative amount of individual elements of conductive material and oxides on the surface of a conductor before and after making a solder stop according to the present invention. The relative amounts of individual elements before and after making the solder stop was determined by the electron emissions (counts) of a scanning electron microscope. The dotted line represents the amount of conductive material and oxides at the solder stop formed by a laser. The solid line represents the amount of conductive material and oxides on the conductive lead which was not laser flashed (clean area). The conductor was prepared from a DuPont QS 170 composition which is believed to include Ag at a weight percent of 75% as a conductive material and 3% to 10% weight percent as glass frits and inorganic oxides. The solder stop was formed by directing the above described laser set at Power—1.5 watts, Q Rate—12 kHz, Bite Size—0.00005", Mode—TMOO, onto the fired conductor pattern for a period of about 0.006 seconds. As illustrated in FIG. 5, the relative amount of oxides is much greater at the solder stop than the area not laser flashed.

FIG. 6 is a photomicrograph of the conductor having a solder stop illustrated in FIG. 5 and magnified 620 times. The portion of the photomicrograph which is relatively smooth compared to the rest of the photomicrograph is the solder stop.

FIG. 7 is a photomicrograph of the conductor of FIG. 5 magnified 1200 times.

Figure 8:
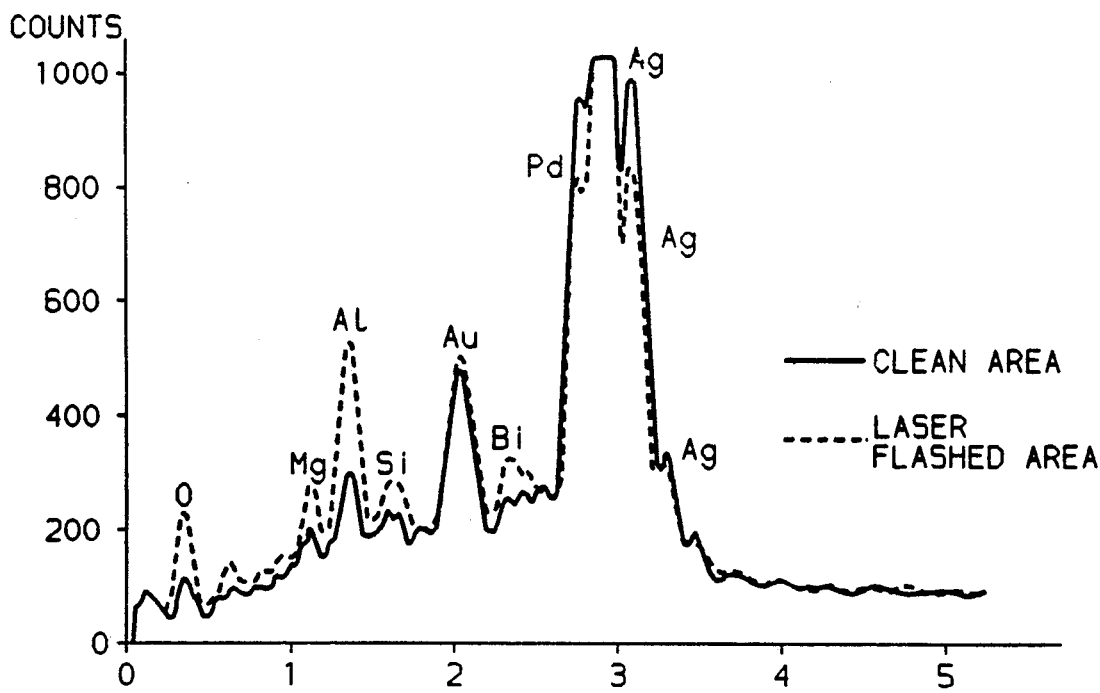
FIG. 8 is a graphical representation of the amount of conductive material on the surface of a conductor before and after making a solder stop according to the present invention.

FIG. 8 is a graphical representation of the relative amount of conductive material and oxides on the surface of a conductor before and after making a solder stop according to the present invention. The relative amounts of individual elements before and after making the solder stop was determined by electron emissions (counts) of a scanning electron microscope. The dotted line represents the amount of conductive material and oxides at the solder stop formed by a laser. The solid line represents the amount of conductive material and oxides on the conductive lead which was not laser flashed (clean area). The conductor was prepared from a DuPont 7484 composition which is believed to include Ag at a 30% to 60% weight percent as a conductive material and 10% to 35% weight percent as glass frits and inorganic oxides. The solder stop was formed by directing the above described laser set at Power—1.5 watts, Q Rate—20 kHz, Bite Size 0.00005", Mode—TMOO, onto the fired conductor pattern for a period of about 0.004 seconds. As illustrated in FIG. 8, the relative amount of oxides is much greater at the solder stop than the area not laser flashed.

FIG. 9 is a photomicrograph of the conductor having a solder stop illustrated in FIG. 8 and magnified 620 times. The portion of the photomicrograph which is relatively smooth compared to the rest of the photomicrograph is the solder stop.

FIG. 10 is a photomicrograph of the conductor of FIG. 8 magnified 1200 times.

FIG. 11 is an illustration of a cross-section view of an electrically conductive lead having a solder stop according to the present invention. The electrically conductive lead 10 has a bottom 12 portion comprising conductive material and inorganic oxides which is adhered to a circuit board 14. Above the bottom portion of the electrically conductive lead is a solder stop 16. The character of the solder stop is such that molten solder will not flow onto it. The solder stop may consist essentially of inorganic oxides. The solder stop does not extend throughout the thickness of the lead. Preferably, the solder stop extends about 0.000005" to about 0.00005" from the top surface 18 of the electrically conductive lead toward the circuit board for a lead which is approximately 0.00025" thick.

FIG. 12 is an illustration of a cross-sectional view of a solder stop of the present invention taken along the longitudinal axis of the lead. The conductive lead 20 is adhered to a circuit board 22 and has a first portion 24 comprising a conductive material and an inorganic oxide; and a second portion 26 which acts as a solder stop. The first and second portions each have top surfaces 28 and 30, respectively, which are substantially the same distance from the circuit board top surface 32. Preferably, the solder stop 26 consists essentially of inorganic oxides. The solder stop 26 does not extend through the thickness of the conductive lead but only a distance sufficient such that solder will not flow over the solder stop.

Where particular aspects of the present invention are defined herein in terms of ranges, it is intended that the invention includes the entire range so defined, and any sub-range or multiple sub-ranges within the broad range. By way of example, where the invention is described as comprising one to about 100% by weight component A, it is intended to convey the invention as including about 5% to about 25% by weight component A, and about 50% to about 75% by weight component A. Likewise, where the present invention has been described herein as including $A_{1-100}B_{1-50}$, it is intended to convey the invention as $A_{1-60}B_{1-20}$, $A_{60-100}B_{25-50}$ and $A_{43}B_{37}$.

The embodiments of the invention in which an exclusive property or privilege is claimed are defined as follows:

1. An electrically conductive printed lead having a solder stop formed thereon and said lead adhered to a substrate, said conductive printed lead comprising first and second contiguous top surfaces in substantially the same plane, said first top surface comprising a conductive material and an inorganic oxide, and said second top surface forming said solder stop and consisting essentially of a fused inorganic oxide extending into the thickness of the lead a distance sufficient to stop solder from flowing over the second top surface but not extending through the thickness of the lead.

2. An electrically conductive printed lead as set forth in claim 1 wherein said first and second top surfaces are at substantially equal distances from said substrate.

3. An electrically conductive printed lead as set forth in claim 1 wherein said inorganic oxide in said second surface consist essentially of the same inorganic oxide in said first surface.

4. An electrically conductive printed lead as set forth in claim 1 wherein said second surface has a width ranging from about 0.002" to about 0.250".

5. An electrically conductive printed lead as set forth in claim 1 wherein said conductive material comprises at least one selected from the group consisting of silver, palladium, platinum, gold, and copper.

6. An electrically conductive printed lead as set forth in claim 1 wherein said inorganic oxide in said first surface comprises at least one selected from the group consisting of lead, ruthenium, cobalt, bismuth, copper and zinc oxides.

7. An electrically conductive printed lead as set forth in claim 1 wherein said inorganic oxide in said second surface comprises at least one selected from the group consisting of lead, ruthenium, cobalt, bismuth, copper and zinc oxides.

8. An electrically conductive printed lead as set forth in claim 1 wherein said inorganic oxide in said first surface comprises glass frit comprising an oxide of at least one material selected from the group consisting of Pb, B, Si, silica, aluminum, boron, and calcium.

9. An electrically conductive printed lead as set forth in claim 1 wherein said inorganic oxide in said second surface comprises glass frit comprising an oxide of at least one material selected from the group consisting of Pb, B, Si, silica, aluminum, boron, and calcium.

10. An electrical interconnection printed lead pattern/integrated circuit chip combination comprising:
a plurality of electrical printed conductors, each conductor having a contact surface wherein said conductor is electrically connected by a solder bump to a predetermined region on an integrated circuit chip, said solder bump being isolated from the remainder of said conductor by a solder stop surface of said conductor contiguous with said contact surface and in substantially the same plane, and said solder stop surface consisting essentially of fused inorganic oxides extending into the thickness of the conductor a distance sufficient to prevent solder from flowing over the solder stop surface but not extending through the thickness of the conductor.

11. A combination as set forth in claim 10 wherein said solder stop surface of said conductor surrounds said solder bump.

12. A combination as set forth in claim 10 wherein said solder stop surface of said conductor, consisting essentially of fused inorganic oxides, is perpendicular to the longitudinal axis of said conductor and wherein said solder bump is isolated by the end of the conductor, the solder stop surface of the fused inorganic oxide and two opposed sides of said conductor.

13. A combination as set forth in claim 10 wherein said solder stop surface of fused inorganic oxides has a window frame shape so as to surround said flexible solder bump on four sides.

14. An electrically conductive lead adhered to a substrate, said conductive lead comprising first and second portions, said first portion comprising a conductive material and an inorganic oxide, and said second portion consisting essentially of a fused inorganic oxide, said second portion consisting essentially of a fused inorganic oxide being partially embedded in the lead and so that the first and second portions form contiguous top surfaces in the same plane, and wherein said lead is prepared from a single composition comprising about 10% to about 90% by weight of a conductive material comprising at least one selected from the group consisting of Pd, Ag, Pt, and Cu, and about 3% to about 40% by weight of an inorganic oxide comprising at least one selected from the group consisting of lead, ruthenium, cobalt, bismuth, copper and zinc oxides and glass frit.

15. A substrate having an electrically conductive printed lead adhered thereto;
a solder bump formed on the top surface of the lead and isolated by a solder stop formed on the lead;
said conductive printed lead comprising first and second contiguous top surfaces in substantially the same plane, said first top surface comprising a conductive material and an inorganic oxide, the second top surface forming said solder stop and consisting essentially of a fused inorganic oxide material extending into the thickness of the lead a distance sufficient to stop solder from flowing over the second top surface of the lead but not extending through the thickness of the lead.

* * * * *